United States Patent
Murakami et al.

(10) Patent No.: US 7,253,069 B2
(45) Date of Patent: Aug. 7, 2007

(54) METHOD FOR MANUFACTURING SILICON-ON-INSULATOR WAFER

(75) Inventors: Yoshio Murakami, Tokyo (JP); Toru Yamazaki, Tokyo (JP); Yoshiro Aoki, Tokyo (JP); Akihiko Endo, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 82 days.

(21) Appl. No.: 11/101,870

(22) Filed: Apr. 8, 2005

(65) Prior Publication Data

US 2005/0227462 A1    Oct. 13, 2005

(30) Foreign Application Priority Data

Apr. 9, 2004    (JP)    ............... 2004-115569

(51) Int. Cl.
  *H01L 21/331*    (2006.01)
  *H01L 21/8222*   (2006.01)
(52) U.S. Cl. ............ 438/311; 438/475; 257/E21; 257/32; 257/311; 257/319

(58) Field of Classification Search ........... 438/311, 438/118, 122, 474, 475, 477, 753, 660, 689
See application file for complete search history.

(56) References Cited

U.S. PATENT DOCUMENTS

| | | | | |
|---|---|---|---|---|
| 5,877,070 A * | 3/1999 | Goesele et al. | ............. | 438/458 |
| 6,150,239 A * | 11/2000 | Goesele et al. | ............. | 438/458 |
| 6,159,829 A * | 12/2000 | Warren et al. | ............. | 438/530 |
| 6,593,211 B2 * | 7/2003 | Sato | ............. | 438/455 |
| 7,052,948 B2 * | 5/2006 | Murphy et al. | ............. | 438/219 |

* cited by examiner

*Primary Examiner*—David Nhu
(74) *Attorney, Agent, or Firm*—Heslin Rothenberg Farley & Mesiti P.C.

(57) ABSTRACT

A method for manufacturing a SOI wafer includes a step of heat-treating a wafer in a furnace to form an SOI wafer including a silicon support, an insulating layer containing oxide, and a superficial silicon layer arranged in that order and a step of unloading the SOI wafer from the furnace maintained at a temperature of 250° C. to 800° C. to transfer the SOI wafer to an atmosphere containing hydrogen or water. The steps are performed in that order.

12 Claims, 5 Drawing Sheets

METHOD FOR MANUFACTURING SILICON-ON-INSULATOR WAFER

BACKGROUND OF THE INVENTION

1. Field of the Invention

The present invention relates to a method for manufacturing a wafer including a superficial silicon layer, an insulating layer containing oxide, and a silicon support arranged in that order. This type of wafer is referred to as a silicon-on-insulator (SOI) wafer.

2. Description of the Related Art

In general, a separation-by-implanted oxygen (SIMOX) process or a bonding process is used to manufacture SOI wafers including superficial silicon layers, insulating layers containing oxide, and silicon supports arranged in that order. In the SIMOX process, oxygen ions are implanted into a silicon wafer and the resulting silicon wafer is heat-treated at a predetermined temperature, whereby an insulating layer is formed in the silicon wafer. Such an insulating layer is referred to as a buried oxide (BOX) layer. In the bonding process, an oxide layer is formed on a first silicon wafer to be processed into a superficial silicon layer and then bonded to a second silicon wafer to be processed into a silicon support and the first silicon wafer is reduced in thickness such that the first silicon wafer has a predetermined thickness.

In particular, for the SIMOX process, the silicon wafer containing the oxygen ions is placed in a furnace and then heat-treated at, for example, 1,350° C. or more in a heat-treating step, whereby the insulating layer is formed. In the heat-treating step, oxygen or a gas mixture containing argon and a small amount of oxygen is supplied to the furnace. Therefore, the silicon wafer is heat-treated in an atmosphere containing oxygen or argon together with a small amount of oxygen. The heat-treated silicon wafer is taken out of the furnace in an unloading step. In the unloading step, gas in the furnace is replaced with nitrogen and the temperature of the furnace is reduced to 800° C. or less. Since large-diameter wafers having a diameter of, for example, 300 mm have been recently used, the temperature of the furnace is usually reduced to 600° C. or less in the unloading step. This is because slip that causes a deterioration in the quality and/or yield of SOI wafers must be prevented from occurring.

On the other hand, for the bonding process, the first and second silicon wafers and the oxide layer are placed in a furnace and then heat-treated at, for example, 1,000° C. or more in a heat-treating step, whereby the second silicon wafer and the oxide layer are securely bonded to each other; that is, the interface between the second silicon wafer and the oxide layer is enhanced in bonding strength. This leads to the formation of an SOI wafer. In the heat-treating step, nitrogen or oxygen is supplied to the furnace and the first and second silicon wafers and the oxide layer are therefore heat-treated in a nitrogen or oxygen atmosphere. The SOI wafer is taken out of the furnace in an unloading step. In the unloading step, gas in the furnace is replaced with nitrogen as described about the SIMOX process and the temperature of the furnace is reduced to 800° C. or less. As described about the SIMOX process, since large-diameter wafers having a diameter of, for example, 300 mm have been recently used, the temperature of the furnace is usually reduced to 600° C. or less in the unloading step.

In the bonding process, after the unloading step is performed, in order to remove an oxide film present on the first silicon wafer, in order to remove defects from the first silicon wafer, and in order to adjust the thickness of the first silicon wafer, the first silicon wafer is polished in a polishing step, whereby the superficial silicon layer is obtained.

After the heat-treating step is performed, in order to adjust the thickness of the SOI wafer, a sacrificial oxide layer may be formed on the superficial silicon layer, whereby the thickness of the superficial silicon layer is reduced. This step may be also performed when the SIMOX process is used. In the sacrificial oxide layer-forming step, the SOI wafer is placed in a furnace to which oxygen is supplied, whereby the SOI wafer is heat-treated at, for example, 1,000° C. or more in an oxygen atmosphere. After this step is performed, a subsequent unloading step as well as the unloading step performed subsequent to the heat-treating step is performed.

The inventors have investigated properties of the interfaces between superficial silicon layers and insulating layers of SOI wafers prepared by a known method. The investigation showed that the electron mobility of the interfaces therebetween was low because the interfaces had high interface state density. That is, the electron mobility of the interfaces is in inverse proportion to the interface state density.

If electronic devices such as transistors are manufactured from SOI wafers having high interface state density, such electronic devices suffer from the following problems: a shift in threshold voltage, an increase in subthreshold characteristic, and a deterioration in performance. That is, the electronic devices are unsatisfactory in performance and reliability.

In order to manufacture electronic devices having high performance and reliability using SOI wafers, such SOI wafers must have low interface state density.

Characteristic electronic defects at the Si—$SiO_2$ interface, Appl. Phys. Lett., 1983, 43, p. 563 (hereinafter referred to as Non-patent Document 1) discloses that the increase in the interface state density at the Si/$SiO_2$ interfaces is caused by free bonds of silicon atoms present at the interfaces, the free bonds being usually referred to as dangling bonds. Passivation and depassivation of silicon dangling bonds at the Si/$SiO_2$ interface by atomic hydrogen, Appl. Phys. Lett., 1993, 63, p. 1510 (hereinafter referred to as Non-patent Document 2) discloses a technique for terminating dangling bonds with atomic hydrogen. This technique is useful in reducing the number of dangling bonds at the Si/$SiO_2$ interface. Therefore, the following procedure is probably effective in reducing the interface state density at the Si/$SiO_2$ interface: an SOI wafer is prepared and then heat-treated in a hydrogen atmosphere, whereby hydrogen is introduced into the interface between a superficial silicon layer and insulating layer of the SOI wafer.

Japanese Unexamined Patent Application Publication No. 2002-26299 discloses the following procedure: nitrogen precipitates containing a predetermined amount of nitrogen are provided on an SOI wafer for fabricating electronic devices, whereby the interface state density at the Si/$SiO_2$ interface is reduced.

For the technique and procedures described above, the number of manufacturing steps is large; hence, a manufacturing system is complicated and manufacturing cost is high. Therefore, the following method is demanded: a simple method for manufacturing an SOI wafer having low interface state density.

SUMMARY OF THE INVENTION

Accordingly, it is an object of the present invention to provide a simple method for manufacturing an SOI wafer having low interface state density.

The present invention has been made to achieve the above object. A method for manufacturing a SOI wafer according to the present invention includes a step of heat-treating a wafer in a furnace to form an SOI wafer including a silicon support, an insulating layer containing oxide, and a superficial silicon layer arranged in that order and also includes a step of unloading the SOI wafer from the furnace maintained at a temperature of 250° C. to 800° C. to transfer the SOI wafer to an atmosphere containing hydrogen or water. The steps are performed in that order.

The inventors have performed various investigations and found that hydrogen can be introduced into the interfaces between superficial silicon layers and insulating layers during unloading steps by controlling the temperature of furnaces and conditions of atmospheres to which SOI wafers are transferred during the unloading steps and the interface state density of the SOI wafers can thereby reduced. In the method of this embodiment, since the furnace is maintained at a temperature of 250° C. to 800° C. during the unloading step and the atmosphere to which the SOI wafer is transferred contains hydrogen or water, hydrogen can be introduced into the interface between the superficial silicon layer and the insulating layer during the unloading step, which is included in known methods, whereby the interface state density of the SOI wafer can be reduced without causing an increase in the number of manufacturing steps.

In the method, the SOI wafer is preferably unloaded from the furnace maintained at a temperature of 350° C. to 750° C. and then transferred to an atmosphere containing 0.1% or more of hydrogen or water on a volume basis. This leads to the introduction of hydrogen into the interface therebetween to achieve a reduction in interface state density.

In the method, it is preferable that the furnace be supplied with gas during the unloading step and the gas flow out of the furnace through an outlet port of the furnace at a flow rate of 20 slm or less. This prevents the SOI wafer taken out of the furnace from being kept away from the atmosphere containing hydrogen or water due to the gas flow out of the furnace. Therefore, hydrogen can be introduced into the interface therebetween, whereby the interface state density can be reduced. In order to readily introduce hydrogen into the interface, the gas preferably flows out of the furnace at a flow rate of 5 slm or less.

The inventors found that when nitrogen is supplied to the furnace maintained at 600° C. or less during the unloading step, the interface state density cannot be markedly reduced; however, the interface state density can be markedly reduced by supplying argon to the furnace maintained at 600° C. or less. Therefore, in the above method, the furnace is preferably supplied with argon during the unloading step.

In the method, the furnace is preferably supplied with a gas mixture containing 0.1% or more of hydrogen or water on a volume basis during the unloading step. This leads to a reduction in interface state density if the furnace is maintained at 600° C. or less and supplied with nitrogen.

In the method, it is preferable that the furnace be of a vertical type, the SOI wafer be taken out of a lower section of the furnace, and the furnace be supplied with gas having a density greater than that of the atmosphere to which the SOI wafer is transferred. According to this combination, since the gas supplied to the furnace flows downward to stir a portion of the atmosphere which contains hydrogen or water and which is present under the SOI wafer taken out of the furnace, hydrogen or water contained in the stirred portion makes contact with the SOI wafer. This leads to the introduction of hydrogen into the interface therebetween to achieve a reduction in interface state density.

In the method, the SOI wafer is preferably unloaded from the furnace at a rate of 20 to 500 mm/min. Since the SOI wafer is taken out of the furnace in such a manner that the SOI wafer is placed on a boat, the SOI wafer is heat-treated at a temperature lower than that of the furnace after the SOI wafer is taken out of the furnace. Therefore, when the rate of unloading the SOI wafer from the furnace is more than 500 mm/min, the time for heat-treating the SOI wafer at an effective temperature is insufficient to reduce the interface state density. In contrast, when the unloading rate is less than 20 mm/min, the throughput in manufacturing SOI wafers is low. Therefore, in order to reduce the interface state density without causing a decrease in the throughput in manufacturing SOI wafers, the unloading rate is preferably 20 to 500 mm/min and more preferably 50 to 100 mm/min.

If a method for manufacturing an SOI wafer includes a plurality of heat-treating steps performed for various purposes, the advantages described above can be achieved by unloading the SOI wafer from a furnace during at least one of the heat-treating steps under the conditions described above. In particular, if the SOI wafer is unloaded from a furnace during the last heat-treating step under the conditions described above, the advantages can be readily achieved.

According to the present invention, the interface state density of an SOI wafer can be reduced without causing an increase in the number of manufacturing steps.

BRIEF DESCRIPTION OF THE DRAWINGS

FIG. 3 is an illustration showing a system for measuring the electron mobility and the interface state density using a simple FET;

DESCRIPTION OF THE PREFERRED EMBODIMENT

Figure 1:
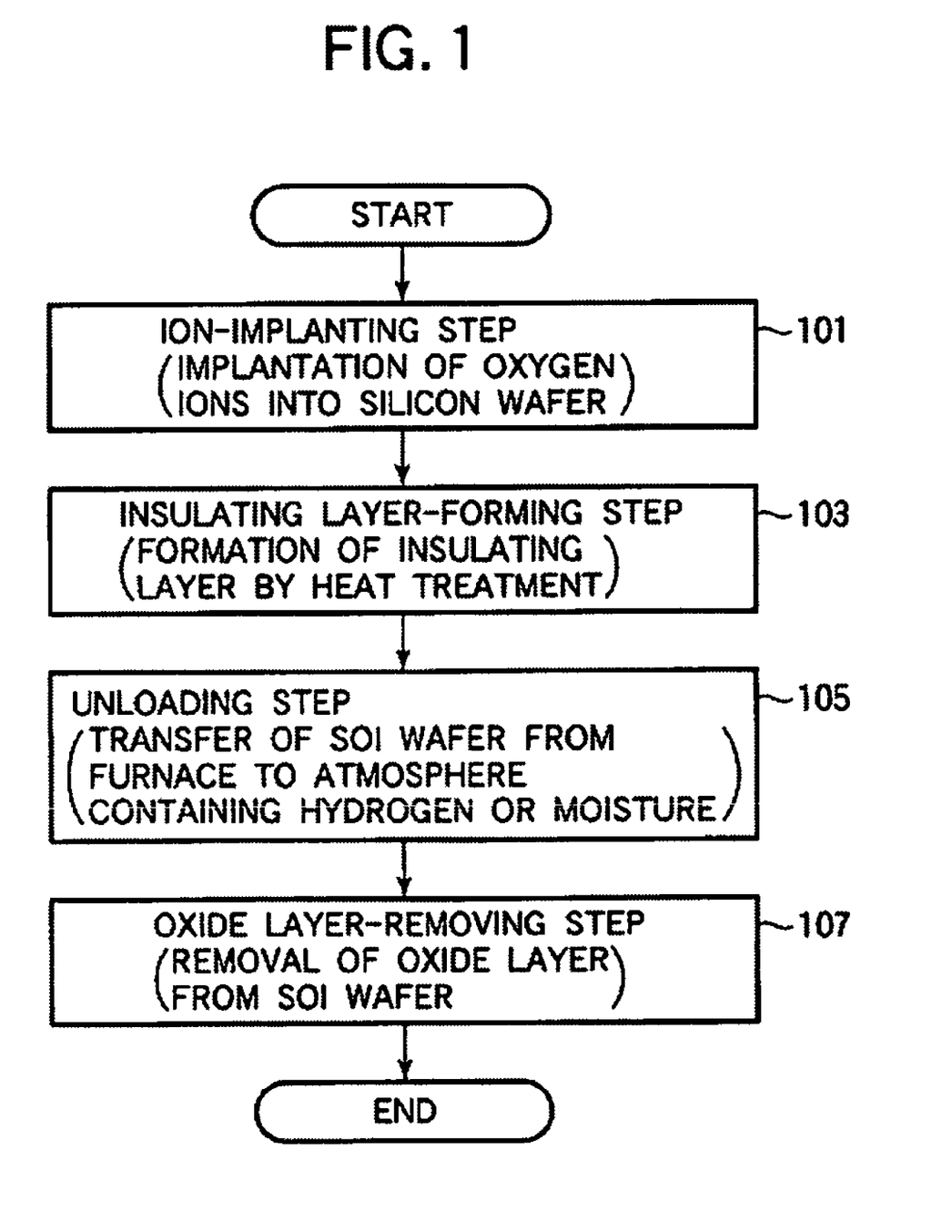
FIG. 1 is a flow chart illustrating a procedure for forming an SOI wafer according to an embodiment of the present invention using a SIMOX process.
Figure 2:
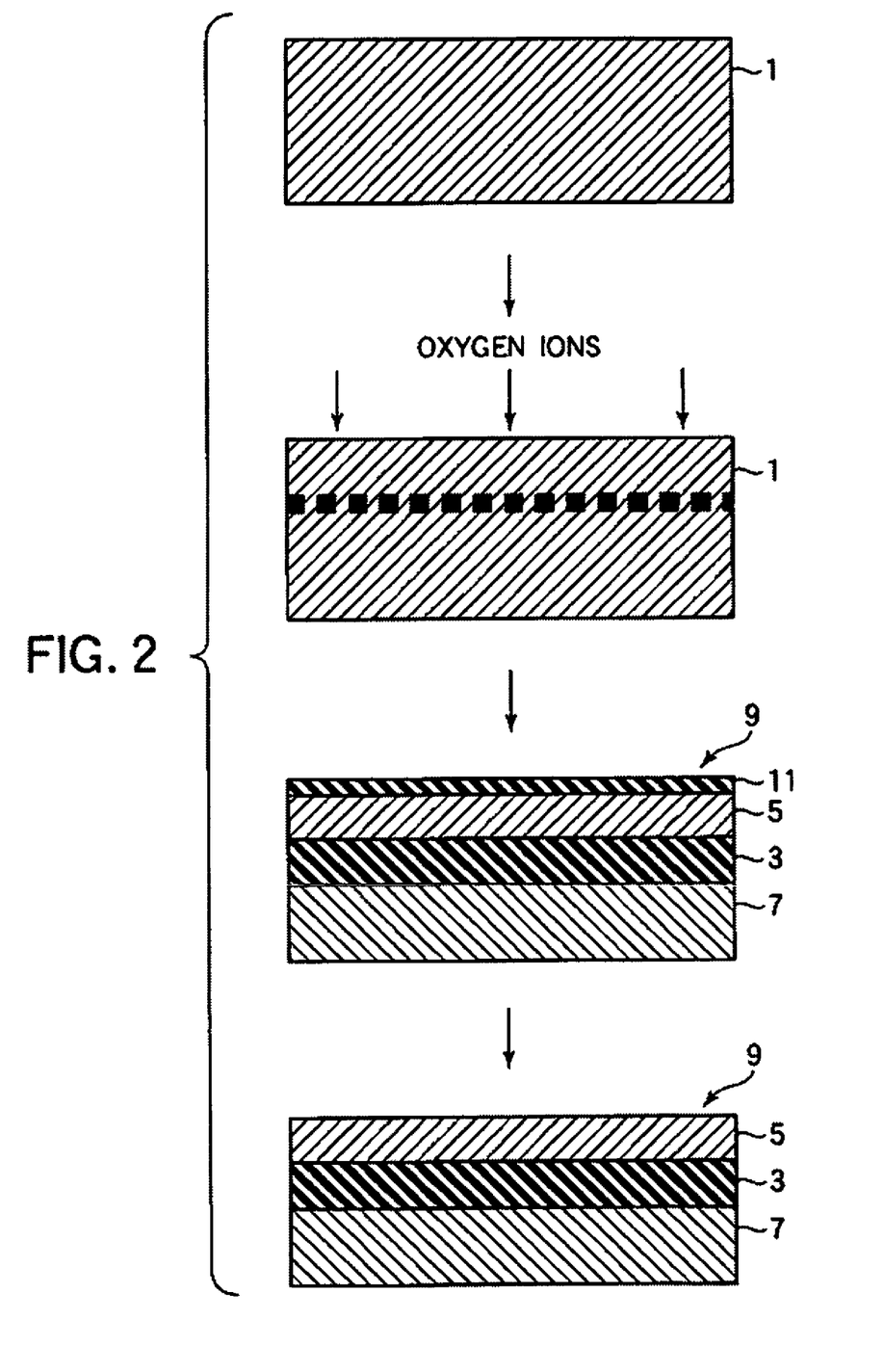
FIG. 2 is a schematic view showing the procedure.
Figure 3A:
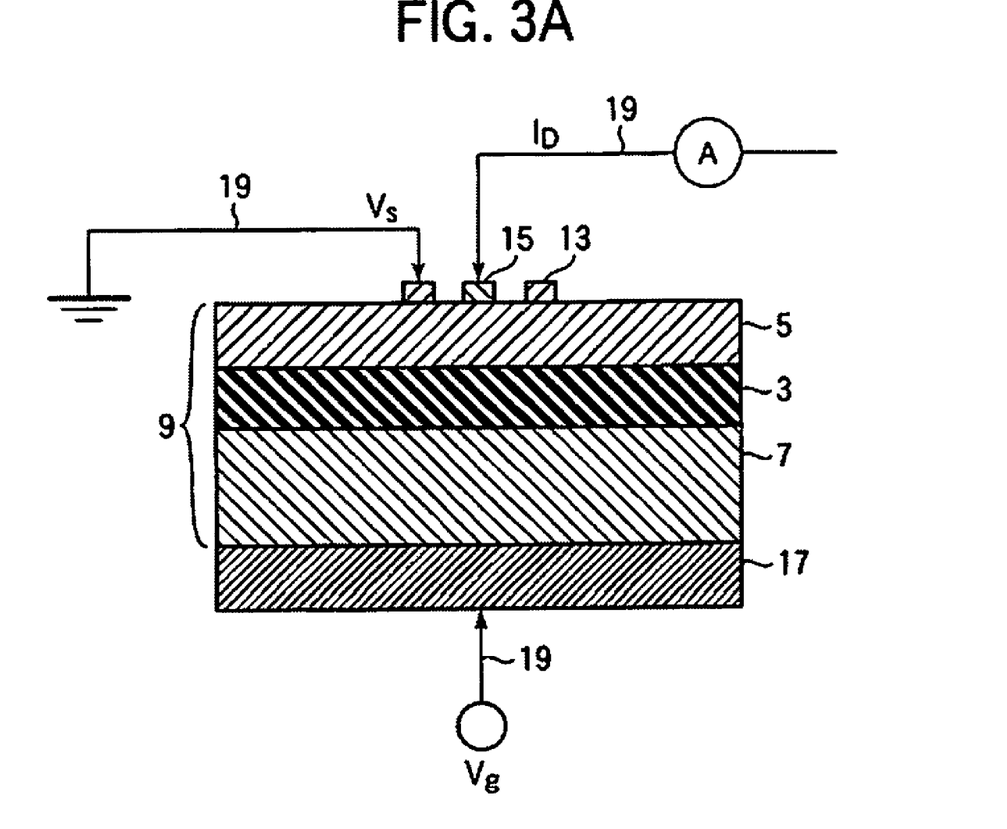
FIG. 3A is a sectional view showing the FET.
Figure 3B:
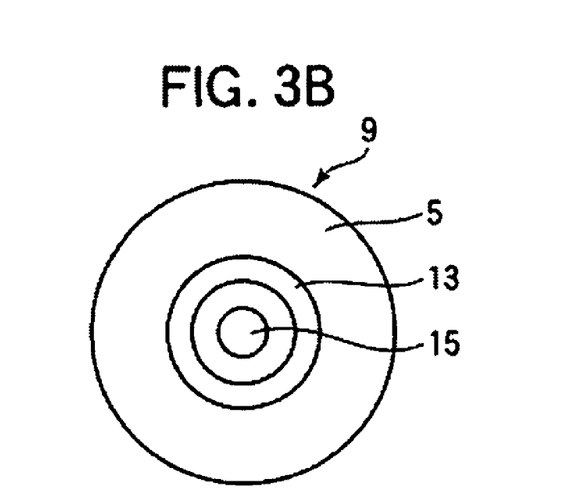
FIG. 3B is plan view showing the FET when viewed from a face of the FET that has the source electrode and the drain electrode.
Figure 4:
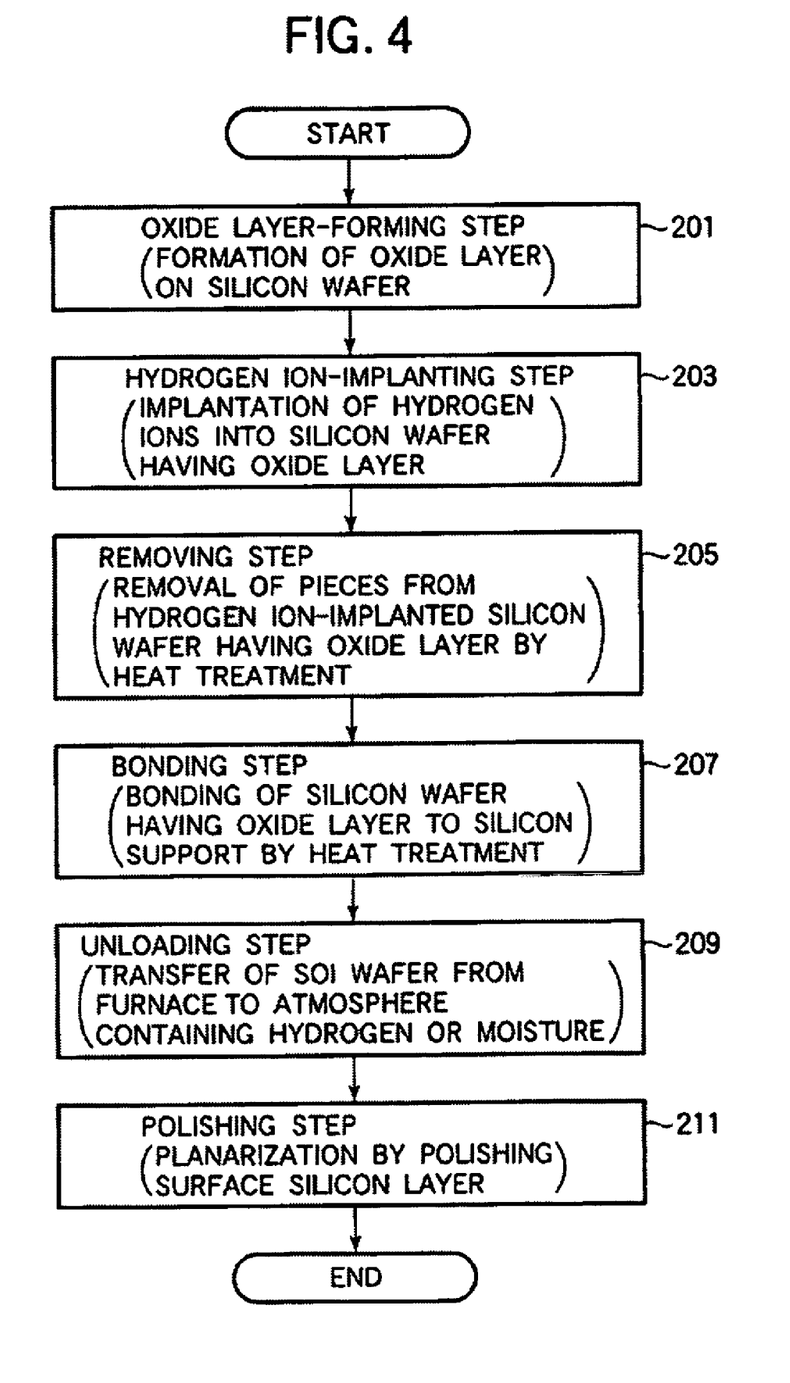
FIG. 4 is a flow chart illustrating a procedure for forming an SOI wafer according to an embodiment of the present invention using a bonding process.
Figure 5:
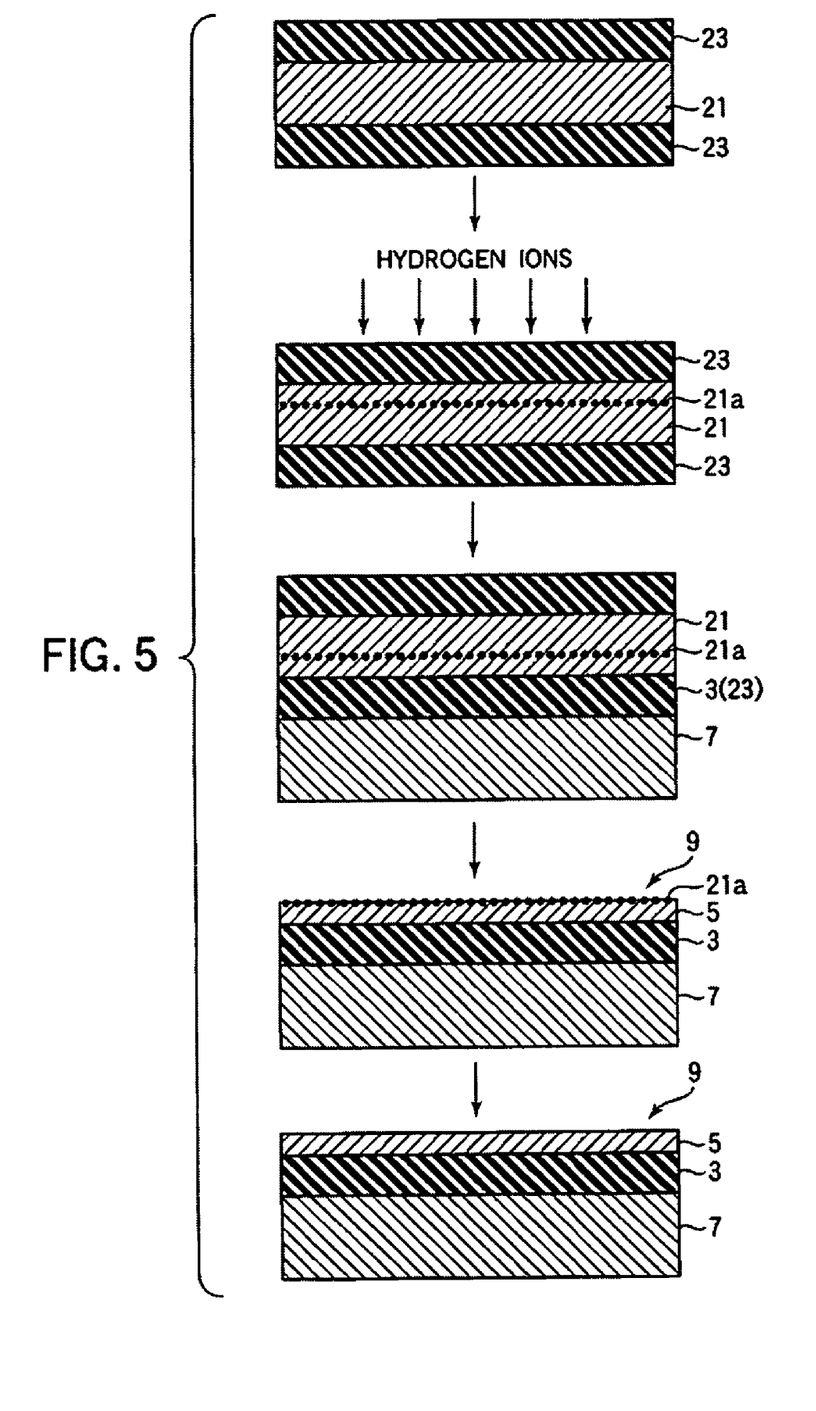
FIG. 5 is a schematic view showing this procedure.

A method for manufacturing an SOI wafer according to an embodiment of the present invention will now be described with reference to FIGS. 1 to 5. FIG. 1 is a flow chart illustrating a procedure for forming an SOI wafer using a SIMOX process. FIG. 2 is a schematic view showing the procedure. FIG. 3 is an illustration showing a system for measuring the electron mobility and the interface state density using a simple FET. FIG. 3A is a sectional view showing the FET and FIG. 3B is plan view showing the FET when viewed from a face of the FET that has the source electrode and the drain electrode. FIG. 4 is a flow chart illustrating a procedure for forming an SOI wafer using a bonding process. FIG. 5 is a schematic view showing this procedure.

An ordinary method for manufacturing an SOI wafer uses one of two processes described below. One is a SIMOX process in which oxygen ions are implanted into a silicon wafer by heating the silicon wafer to a predetermined temperature and then annealed, whereby an insulating layer referred to as a buried oxide layer (hereinafter referred to as a BOX layer) is formed in the silicon wafer. The other one is a bonding process in which an oxide layer is formed on a silicon wafer in advance and then bonded to another silicon wafer, which is reduced in thickness so as to have a predetermined thickness.

The method of this embodiment that uses the SIMOX process is as described below. The method principally includes a step of heat-treating a wafer in a furnace to form an SOI wafer and a step of unloading the SOI wafer from the furnace. As shown in FIGS. 1 and 2, the method particularly includes an ion-implanting step (hereinafter referred to as Step 101) of implanting oxygen ions into a silicon wafer 1, an insulating layer-forming step (hereinafter referred to as Step 103) of forming an insulating layer 3 containing silicon dioxide by heat-treating the silicon wafer 1 in a furnace to form an SOI wafer 9, an unloading step (hereinafter referred to as Step 105) of unloading the SOI wafer 9 from the furnace, and an oxide film-removing step (hereinafter referred to as Step 107) of removing a thermal oxide film 11 present on a superficial silicon layer 5. These steps are performed in that order. The insulating layer 3 may be referred to as a BOX layer.

In particular, in Step 101, the silicon wafer 1 is prepared and then subjected to ion implantation under the following conditions such that oxygen ions reach a predetermined zone of the silicon wafer 1: an acceleration energy of 170 keV and a dose of $5 \times 10^{17}/cm^2$. In Step 103, the resulting silicon wafer 1 is placed in the furnace to which a gas mixture containing argon and a small amount of oxygen is supplied and then heat-treated at, for example, 1,350° C. for about six hours or more in the atmosphere in the furnace that contains argon and oxygen, whereby the wafer zone containing the oxygen ions is converted into the insulating layer 3. Since the insulating layer 3 is created in the silicon wafer 1, a region of the silicon wafer 1 that is present on the insulating layer 3 is converted into the superficial silicon layer 5 and a region of the silicon wafer 1 that is present under the insulating layer 3 is converted into a silicon support 7, whereby the SOI wafer 9 is formed.

In Step 105, the SOI wafer 9 is unloaded from the furnace and then transferred to a chamber or clean room connected to an inlet or outlet port of the furnace. The atmosphere in the chamber or the clean room contains hydrogen or water. When the SOI wafer 9 is unloaded from the furnace, the furnace is maintained at 250° C. to 800° C.

When the furnace temperature is less than 250° C. during the unloading of the SOI wafer 9, hydrogen cannot be introduced into the SOI wafer 9 even if the atmosphere in the chamber or the clean room contains hydrogen or water; hence, the interface between the superficial silicon layer 5 and the insulating layer 3 cannot be reduced in interface state density. In contrast, when the furnace temperature is more than 800° C. during the unloading of the SOI wafer 9, slip occurs in the SOI wafer 9 without depending on the diameter of the SOI wafer 9 because a difference in temperature between the SOI wafer 9 and the chamber or the clean room is excessively large. This leads to a deterioration in the quality of the SOI wafer 9 or a decrease in the yield of SOI wafers. Thus, the furnace temperature is preferably 250° C. to 800° C. during the unloading of the SOI wafer 9.

Furthermore, it is more preferable that the furnace temperature be 350° C. or more during the unloading of the SOI wafer 9 and the atmosphere in the chamber or the clean room contain 0.1% or more of hydrogen or water on a volume basis. This is because hydrogen can be securely introduced into the interface between the superficial silicon layer 5 and the insulating layer 3 and the interface therebetween is thereby reduced in interface state density. In order to introduce hydrogen into the interface therebetween, it is also more preferable that the furnace temperature be 750° C. or less during the unloading of the SOI wafer 9 and the atmosphere in the chamber or the clean room have such a content. This is because slip can be prevented from occurring in the SOI wafer 9; hence, the SOI wafer 9 can be prevented from being deteriorated in quality or SOI wafers can be prevented from being decreased in yield.

During the unloading of the SOI wafer 9, gas used to heat-treat the silicon wafer 1 in Step 103 may be supplied to the furnace. In general, when silicon wafers are heat-treated in furnaces, oxygen and an inert gas such as nitrogen or argon are supplied to the furnaces. Therefore, nitrogen or argon and oxygen may be supplied to the furnace during the unloading of the SOI wafer 9.

The gas supplied to the furnace in this step flows out of the furnace through the inlet or outlet port. A sufficient amount of hydrogen to reduce the interface state density cannot be introduced into the SOI wafer 9 depending on the amount of the gas flowing out of the furnace. This is because the gas flowing out of the furnace probably flows around the SOI wafer 9 unloaded from the furnace and therefore prevents the SOI wafer 9 from being in contact with the atmosphere containing hydrogen or water to, thus preventing hydrogen from penetrating the SOI wafer 9.

When the flow rate of the gas flowing out of the furnace is 20 slm or less, the interface state density can be reduced. When the flow rate of the gas flowing out of the furnace is 5 slm or less, the interface state density can be more securely reduced. Therefore, the flow rate of the gas flowing out of the furnace is preferably 20 slm or less and more preferably 5 slm or less.

When the rate of unloading the SOI wafer 9 from the furnace is 20 to 500 mm/min, the interface state density can be reduced. Since the SOT wafer 9 is taken out of the furnace in such a manner that the SOT wafer 9 is placed on a boat, the SOI wafer 9 is heat-treated at a temperature lower than that of the furnace after the SOT wafer 9 is taken out of the furnace. Therefore, hydrogen can be introduced into the SOT wafer 9 and the interface state density is therefore reduced, because the unloading rate ranges from 20 to 500 mm/min and the SOT wafer 9 is therefore heat-treated for a sufficient time under the conditions described above.

When the unloading rate is more than 500 mm/min, the time for heat-treating the SOT wafer 9 is insufficient to reduce the interface state density. When the unloading rate is less than 20 mm/min, the throughput in manufacturing SOT wafers is low. Therefore, in order to reduce the interface state density without causing a decrease in the throughput in manufacturing SOT wafers, the unloading rate is preferably 20 to 500 mm/min and more preferably 50 to 100 mm/min.

If the furnace is of a vertical type and the SOT wafer 9 is taken out of a lower section of the furnace, the interface state density can be reduced by supplying gas, such as oxygen, argon, or the mixture thereof, to the furnace during the unloading the SOT wafer 9. Such gas has a density greater than that of the atmosphere in the chamber or the clean room to which the SOI wafer 9 is transferred when the atmosphere contains, for example, air. This is because the gas supplied to the furnace probably flows downward to stir a portion of the atmosphere which contains hydrogen or water and which is present under the SOI wafer 9 taken out of the furnace and hydrogen or water contained in the stirred portion makes contact with the SOI wafer 9.

In Step 107, the thermal oxide film 11 formed on the SOI wafer 9 is removed using hydrofluoric acid or another acid, whereby the SOI wafer 9 is finished.

A procedure for investigating the relationship between the following factors will now be described: the kind and content of gas supplied to a furnace in Step 105, the temperature of heat treatment, the electron mobility at a superficial silicon layer and an insulating layer, and the interface state density. SOI wafers having the same configuration as that of the SOI wafer 9 are prepared by processing boron-doped p-type wafers having a diameter of 200 mm according to Steps 101 to 107 shown in FIG. 1. The SOI wafers are cleaned with hydrofluoric acid, whereby native oxides are removed therefrom. The SOI wafers are further cleaned with pure water and then dried by nitrogen blowing.

As shown in FIG. 3, after the SOI wafers are dried, the following electrodes containing mercury are formed on a superficial silicon layer 5 of each SOI wafer 9: a circular source electrode 13 and a drain electrode 15 placed at the center of the source electrode 13. A gate electrode 17 containing aluminum is formed on a silicon support 7 of the SOI wafer, whereby a simple MOSFET is obtained. The source electrode 11, the drain electrode 13, and the gate electrode 15 are connected to power supplies with wires 19. According to this procedure, samples for the investigation are obtained. A voltage is applied between the source electrode 13 and the drain electrode 15 of each sample and a voltage is applied to the gate electrode 17 of the sample, whereby an Ids-Vgs curve is obtained. The interface state density and electron mobility of the sample is calculated from this curve. Table 1 shows the results of the investigation.

TABLE 1

| Furnace Temperature at Start of Unloading | Gas Supplied to Furnace | Electron Mobility [cm²/V/sec] | Interface State Density [1 × 10¹¹ cm⁻²/eV] |
| --- | --- | --- | --- |
| 700° C. | $N_2$ | 650 | 4.5 |
| 600° C. | $N_2$ | 530 | 10.3 |
| 500° C. | $N_2$ | 500 | 12 |
| 600° C. | Ar | 620 | 4.8 |
| 600° C. | $N_2$ and 0.1% of $H_2O$ | 670 | 4 |
| 600° C. | $N_2$ and 0.1% of $H_2$ | 690 | 3.8 |
| 500° C. | $N_2$ and 0.1% of $H_2$ | 620 | 4.7 |
| 400° C. | $N_2$ and 0.1% of $H_2$ | 590 | 4.9 |
| 300° C. | $N_2$ and 0.1% of $H_2$ | 540 | 7.5 |

As is clear from Table 1, the sample including the SOI wafer unloaded from the furnace to which nitrogen is supplied and of which the temperature is 700° C. has low interface state density and high electron mobility. However, the samples including the SOI wafers unloaded from the furnace to which nitrogen is supplied and of which the temperature is 600° C. or less do not have low interface state density nor high electron mobility.

On the other hand, the sample including the SOI wafer unloaded from the furnace to which argon is supplied and of which the temperature is 600° C. has low interface state density and high electron mobility. Therefore, in order to reduce the interface state density, argon is preferably supplied to the furnace during the unloading of each SOI wafer when the furnace temperature is 600° C. or less.

The samples including the SOI wafers unloaded from the furnace to which a gas mixture containing nitrogen and 0.1% of hydrogen or water on a volume basis is supplied and of which the temperature is 600° C. or less have markedly low interface state density and high electron mobility. Therefore, in order to reduce the interface state density, a gas mixture containing an inert gas and 0.1% or more of hydrogen or water on a volume basis is preferably supplied to the furnace when the furnace temperature is 600° C. or less. Such an inert gas is not limited to nitrogen and any inert gas having no adverse effects on SOI wafers can be used.

Furthermore, the samples including the SOI wafers unloaded from the furnace to which a gas mixture containing 0.1% of hydrogen on a volume basis is supplied and of which the temperature is 400° C. or more has markedly low interface state density.

The method of this embodiment that uses the bonding process is described below. As shown in FIGS. 4 and 5, the method may include an oxide layer-forming step (hereinafter referred to as Step 201) of forming oxide layers 23 on a silicon wafer 21 processed into a superficial silicon layer 5; a hydrogen ion-implanting step (hereinafter referred to as Step 203) of implanting hydrogen ions into the silicon wafer 21; a removing step (hereinafter referred to as Step 205) of bonding a silicon support 7 having a mirror face to one of the oxide layers 23 in such a manner that the mirror face is in contact with the oxide layer 23 to be converted into an insulating layer 3, heat-treating the silicon support 7, the oxide layers 23, and the silicon wafer 21 in a furnace, and then removing the oxide layer 23 placed on the silicon wafer 21 and a part of the silicon wafer 21 to form the insulating layer 3 and the superficial silicon layer 5 to prepare a SOI wafer 9; a bonding step (hereinafter referred to as Step 207) of heat-treating the SOI wafer 9 in a furnace to securely bond the silicon support 7 to the insulating layer 3; an unloading step (hereinafter referred to as Step 209) of unloading the SOI wafer 9 from the furnace; and a polishing step (hereinafter referred to as Step 211) of chemically polishing the superficial silicon layer 5, the steps being performed in that order. In Step 211, defects are removed from the superficial silicon layer 5, the surface roughness of the superficial silicon layer 5 is reduced, and the thickness thereof is adjusted.

In particular, in Step 201, the silicon wafer 21 is prepared and then heat-treated at, for example, 1,000° C. in a humid atmosphere, whereby the oxide layers 23 having a thickness of about 1,350 Å are each formed on both faces of the silicon wafer 21. In Step 203, in order to allow the hydrogen ions to reach a predetermined zone of the silicon wafer 21, ion implantation is performed under the following conditions: an acceleration energy of 50 keV and a dose of $6 \times 10^{16}$/cm². After the ion implantation is performed, the resulting silicon wafer 21 is cleaned.

In Step 205, one of the oxide layers 23 is bonded to the mirror face of the silicon support 7 and this lamination is placed in the furnace and then heat-treated at, for example, 500° C. in such a manner that nitrogen is supplied to the furnace. This allows the oxide layer 23 placed on the silicon wafer 21 and a part 21a implanted with hydrogen ions of the silicon wafer 21 to be removed to form the insulating layer 3 and the superficial silicon layer 5. This leads to the formation of the SOI wafer 9 including the superficial silicon layer 5, the insulating layer 3, and the silicon support 7 arranged in that order.

In Step 207, the cleaned SOI wafer 9 is placed in the furnace, to which nitrogen is supplied, and then heat-treated at, for example, 1,100° C. for 120 minutes, whereby the insulating layer 3 and the silicon support 7 are securely bonded, that is, the bonding strength therebetween is enhanced. In Step 209, the SOI wafer 9 is unloaded from the furnace and then transferred to a chamber or clean room connected to an inlet or outlet port of the furnace in the same manner as described about the method using the SIMOX process. The atmosphere in the chamber or the clean room contains hydrogen or water. When the SOI wafer 9 is unloaded from the furnace, the furnace is maintained at 250° C. to 800° C.

Furthermore, in Step 209, it is preferable that the furnace be maintained at 350° C. or more and the SOI wafer 9 be placed in an atmosphere containing 0.1% of hydrogen or water on a volume basis, as described about the method using the SIMOX process. This is because hydrogen can be readily introduced into the interface between the superficial silicon layer 5 and insulating layer 3 and the interface therebetween can be thereby sufficiently reduced in interface state density. In order to introduce hydrogen into the interface therebetween, it is also preferable that the furnace be maintained at 750° C. or less and the SOI wafer 9 be placed in such an atmosphere. This is because slip can be prevented from occurring in the SOI wafer 9; hence, the SOI wafer 9 can be prevented from being deteriorated in quality or SOI wafers can be prevented from being decreased in yield.

The gas supplied to the furnace used in Step 207 may be supplied to the furnace used to heat-treat the SOI wafer 9 during Step 209, as described about the method using the SIMOX process.

The gas supplied to the furnace during Step 209 flows out of the furnace through the inlet or outlet port. A sufficient amount of hydrogen to reduce the interface state density cannot be introduced into the SOI wafer 9 depending on the amount of the gas flowing out of the furnace. When the flow rate of the gas flowing out of the furnace is 20 slm or less as described about the SIMOX process, the interface state density can be reduced. When the flow rate of the gas flowing out of the furnace is 5 slm or less, the interface state density can be more securely reduced. Therefore, the flow rate of the gas flowing out of the furnace is preferably 20 slm or less and more preferably 5 slm or less.

In order to reduce the interface state density without causing a decrease in the throughput in manufacturing SOI wafers, the rate of unloading the SOI wafer 9 from the furnace is preferably 20 to 500 mm/min and more preferably 50 to 100 mm/min as described about the SIMOX process.

If the furnace used in Step 207 is of a vertical type and the SOI wafer 9 is taken out of a lower section of the furnace, the interface state density can be reduced by supplying a gas, such as oxygen, argon, or the mixture thereof to the furnace during the unloading the SOI wafer 9 as described about the SIMOX process. Such a gas has a density greater than that of the atmosphere in the chamber or the clean room to which the SOI wafer 9 is transferred when the atmosphere contains, for example, air.

In Step 211, the superficial silicon layer 5 of the resulting SOI wafer 9 is chemically polished so as to have a predetermined thickness. This leads to the adjustment of the thickness of the superficial silicon layer 5, the removal of defects therefrom, and the reduction of the surface roughness thereof. The SOI wafer 9 is then cleaned and thereby finished.

A procedure for investigating the relationship between the following factors will now be described: the kind and content of gas supplied to a furnace in Step 209, the temperature of heat treatment, the electron mobility at a superficial silicon layer and an insulating layer, and the interface state density. SOI wafers having the same configuration as that of the SOI wafer 9 are prepared by processing boron-doped p-type wafers having a diameter of 200 mm according to Steps 201 to 211 shown in FIG. 4. The SOI wafers are cleaned with hydrofluoric acid, whereby native oxides are removed therefrom. The SOI wafers are further cleaned with pure water and then dried by nitrogen blowing.

As shown in FIG. 3, after the SOI wafers are dried, the following electrodes containing mercury are formed on a superficial silicon layer 5 of each SOI wafer 9 in the same manner as that of the method using the SIMOX process: a circular source electrode 13 and a drain electrode 15 placed at the center of the source electrode 13. A gate electrode 17 containing aluminum is formed on a silicon support 7 of the SOI wafer, whereby a simple MOSFET is obtained. The source electrode 11, the drain electrode 13, and the gate electrode 15 are connected to power supplies with wires 19. According to this procedure, samples for the investigation are obtained. A voltage is applied between the source electrode 13 and the drain electrode 15 of each sample and a voltage is applied to the gate electrode 17 of the sample, whereby an Ids-Vgs curve is obtained. The interface state density and electron mobility of the sample is calculated from this curve. Table 2 shows the results of the investigation.

TABLE 2

| Furnace Temperature at Start of Unloading | Gas Supplied to Furnace | Electron Mobility [cm$^2$/V/sec] | Interface State Density [1 × 10$^{11}$ cm$^{-2}$/eV] |
|---|---|---|---|
| 700° C. | N$_2$ | 640 | 4.7 |
| 600° C. | N$_2$ | 520 | 10.7 |
| 500° C. | N$_2$ | 500 | 13 |
| 600° C. | Ar | 600 | 4.9 |
| 600° C. | N$_2$ and 0.1% of H$_2$O | 650 | 4.4 |
| 600° C. | N$_2$ and 0.1% of H$_2$ | 680 | 3.9 |
| 500° C. | N$_2$ and 0.1% of H$_2$ | 610 | 4.9 |
| 400° C. | N$_2$ and 0.1% of H$_2$ | 580 | 5.0 |
| 300° C. | N$_2$ and 0.1% of H$_2$ | 530 | 8.5 |

As is clear from Table 2, the samples prepared using the bonding process have properties similar to those of the samples prepared using the SIMOX process. The sample including the SOI wafer unloaded from the furnace to which nitrogen is supplied and of which the temperature is 700° C. has markedly low interface state density and high electron mobility. However, the samples including the SOI wafers unloaded from the furnace to which nitrogen is supplied and of which the temperature is 600° C. or less do not have low interface state density nor high electron mobility.

On the other hand, the sample including the SOI wafer unloaded from the furnace to which argon is supplied and of which the temperature is 600° C. has low interface state density and high electron mobility. Therefore, in order to reduce the interface state density, argon is preferably supplied to the furnace during the unloading of each SOI wafer when the furnace temperature is 600° C. or less.

The samples including the SOI wafers unloaded from the furnace to which a gas mixture containing nitrogen and 0.1% of hydrogen or water on a volume basis is supplied and of which the temperature is 600° C. or less have markedly low interface state density and high electron mobility. Therefore, in order to reduce the interface state density, a gas mixture containing an inert gas and 0.1% or more of hydrogen or water on a volume basis is preferably supplied to the furnace when the furnace temperature is 600° C. or less.

Furthermore, the samples including the SOI wafers unloaded from the furnace to which a gas mixture containing 0.1% of hydrogen on a volume basis is supplied and of which the temperature is 400° C. or more has markedly low interface state density.

According to the method of this embodiment, since a furnace is maintained at a temperature of 250° C. to 800° C. at the start of an unloading step and the atmosphere in a chamber or clean room to which an SOI wafer is transferred contains hydrogen or water, moisture around the SOI wafer and hydrogen generated by decomposing the water or supplied from outside are diffused in the SOI wafer during the unloading step, whereby dangling bonds present at the interface between a superficial silicon layer and an insulating layer included in the SOI wafer are terminated. That is, hydrogen can be introduced into the SOI wafer by varying conditions of the unloading step, which is included in known methods, whereby the interface state density of the SOI wafer can be reduced without causing an increase in the number of manufacturing steps.

Since the number of manufacturing steps is not increased, a manufacturing system is not complicated and manufacturing cost is not increased. Since the interface state density of the SOI wafer can be reduced, electronic devices manufactured from the SOI wafer have high operating speed and low electrical consumption but do not suffer from the following problems: a shift in threshold voltage, an increase in sub-threshold characteristic, and a deterioration in operating speed. Therefore, such electronic devices have high performance and reliability.

Since the unloading step is performed in such a manner that the furnace is maintained at a temperature of 350° C. to 750° C. and the SOI wafer is placed in an atmosphere containing 0.1% or more of hydrogen or water on a volume basis, hydrogen can be readily introduced into the SOI wafer, whereby the interface state density thereof can be reduced. Furthermore, when the furnace is maintained at 400° C. or more, hydrogen can be readily introduced into the SOI wafer by supplying a gas mixture containing 0.1% or more of hydrogen or water on a volume basis to the furnace.

The unloading step is performed in such a manner that gas is supplied to the furnace and the flow rate of the gas flowing out of the furnace is preferably controlled to be 20 slm and more preferably 5 slm. In particular, argon is preferably is supplied to the furnace. Alternatively, a gas mixture containing an inert gas and 0.1% or more of hydrogen or water on a volume basis is preferably supplied to the furnace. This leads to a reduction in interface state density.

If the furnace is of a vertical type and the SOI wafer is taken out of a lower section of the furnace, the interface state density can be reduced by supplying a gas, such as oxygen, argon, or the mixture thereof, to the furnace during the unloading step. Such a gas has a density greater than that of the atmosphere in a chamber or clean room to which the SOI wafer is transferred. According to this operation, since a gas mixture containing hydrogen or water readily makes contact with the SOI wafer, hydrogen can be readily introduced into the SOI wafer during the unloading step, whereby the interface state density can be reduced.

The present invention is not limited to the method of the embodiment and the method of the present invention can be used to manufacture various SOI wafers by heat treatment. The method of the present invention need not include including any hydrogen ion-implanting step nor any removing step but may include a step using a bonding process and a polishing step of removing an unnecessary oxide film and a superficial silicon layer. In order to adjust the thickness of a superficial silicon layer, the method of the present invention may include a step of forming a sacrificial oxide layer on the superficial silicon layer. This step is performed subsequent to an insulating layer-forming step when the SIMOX process is used or performed subsequent to a bonding step when the bonding process is used. In this case, an SOI wafer is unloaded from a furnace, used to form the sacrificial oxide layer, under the conditions described in the embodiment.

If a method for manufacturing an SOI wafer includes a plurality of heat-treating steps performed for various purposes, the advantages described above can be achieved by unloading the SOI wafer from a furnace during at least one of the heat-treating steps under the conditions described in the embodiment. In particular, if the SOI wafer is unloaded from a furnace during the last heat-treating step under the conditions described in the embodiment, the advantages described above can be readily achieved.

What is claimed is:

1. A method for manufacturing a SOI wafer, comprising:
   a step of heat-treating a wafer in a furnace to form an SOI wafer including a silicon support, an insulating layer containing oxide, and a superficial silicon layer arranged in that order; and
   a step of unloading the SOI wafer from the furnace maintained at a temperature of 250°°C. to 800° C. to transfer the SOI wafer to an atmosphere containing hydrogen or water, the steps being performed in that order.

2. The method according to claim 1, wherein the SOI wafer is unloaded from the furnace maintained at a temperature of 350° C. to 750° C. and then transferred to an atmosphere containing 0.1% or more of hydrogen or water on a volume basis.

3. The method according to claim 1, wherein the furnace is supplied with gas during the unloading step and the gas flows out of the furnace through an outlet port of the furnace at a flow rate of 20 slm or less.

4. The method according to claim 1, wherein the furnace is supplied with argon during the unloading step.

5. The method according to claim 1, wherein the furnace is supplied with a gas mixture containing 0.1% or more of hydrogen or water on a volume basis during the unloading step.

6. The method according to claim 1, wherein the furnace is of a vertical type, the SOI wafer is taken out of a lower section of the furnace, and the furnace is supplied with gas having a density greater than that of the atmosphere to which the SOI wafer is transferred.

7. The method according to claim 1, wherein the SOI wafer is unloaded from the furnace at a rate of 20 to 500 mm/mm.

8. The method according to claim 2, wherein the furnace is supplied with gas during the unloading step and the gas flows out of the furnace through an outlet port of the furnace at a flow rate of 20 slm or less.

9. The method according to claim 2, wherein the furnace is supplied with argon during the unloading step.

10. The method according to claim 2, wherein the furnace is supplied with a gas mixture containing 0.1% or more of hydrogen or water on a volume basis during the unloading step.

11. The method according to claim 2, wherein the furnace is of a vertical type, the SOI wafer is taken out of a lower section of the furnace, and the furnace is supplied with gas having a density greater than that of the atmosphere to which the SOI wafer is transferred.

12. The method according to claim 2, wherein the SOI wafer is unloaded from the furnace at a rate of 20 to 500 mm/min.

* * * * *

UNITED STATES PATENT AND TRADEMARK OFFICE
CERTIFICATE OF CORRECTION

PATENT NO.        : 7,253,069 B2
APPLICATION NO.   : 11/101870
DATED             : August 7, 2007
INVENTOR(S)       : Murakami et al.

It is certified that error appears in the above-identified patent and that said Letters Patent is hereby corrected as shown below:

In The Claims:

Claim 1, col. 12, line 37:   delete "250°°C." and insert -- 250°C. --

Claim 7, col. 12, line 63;   delete "mm/mm." and insert -- mm/min. --

Signed and Sealed this

Twentieth Day of November, 2007

JON W. DUDAS
*Director of the United States Patent and Trademark Office*